(12) United States Patent
Vangal

(10) Patent No.: US 6,735,131 B2
(45) Date of Patent: May 11, 2004

(54) WEAK CURRENT GENERATION

(75) Inventor: Sriram R. Vangal, Aloha, OR (US)

(73) Assignee: Intel Corporation, Santa Monica, CA (US)

( * ) Notice: Subject to any disclaimer, the term of this patent is extended or adjusted under 35 U.S.C. 154(b) by 0 days.

(21) Appl. No.: 10/041,855

(22) Filed: Jan. 7, 2002

(65) Prior Publication Data

US 2003/0128577 A1 Jul. 10, 2003

(51) Int. Cl.[7] ................................................. G11C 7/00
(52) U.S. Cl. .............. 365/201; 365/189.05; 365/189.12
(58) Field of Search ........................... 365/201, 189.12, 365/189.05; 327/541, 359

(56) References Cited

U.S. PATENT DOCUMENTS

| 5,559,745 A | * | 9/1996 | Banik et al. ................ 365/201 |
| 5,828,827 A | * | 10/1998 | Mateja et al. ................ 714/30 |
| 5,912,550 A | * | 6/1999 | Sharpe-Geisler ............ 323/273 |
| 6,192,001 B1 | * | 2/2001 | Weiss et al. ........... 365/230.06 |
| 6,256,241 B1 | * | 7/2001 | Mehalel ....................... 365/201 |

OTHER PUBLICATIONS

Meixner et al., "Weak Write Test Mode: An SRAM Cell Stability Design For Test Technique", International Test Conference, Paper BP, IEEE, 0–7803–4209–7/1997, pp. 1043–1052.

* cited by examiner

Primary Examiner—Son T. Dinh
(74) Attorney, Agent, or Firm—Fish & Richardson P.C.

(57) ABSTRACT

Electronic elements that include a weak current source are configured to enable different selected levels of weak current to be delivered to a circuit. A control input is connected to the electronic element to receive control signals that specify a selected level of weak current. The identities and the timing of the control signals are determined by signals delivered through a scan register.

22 Claims, 4 Drawing Sheets

WEAK CURRENT GENERATION

BACKGROUND

This invention relates to weak current generation.

Weak current generation plays a part, for example, in a weak write test mode (WWTM) for static random access memories (SRAMs). The WWTM uses test circuitry that attempts to overwrite data stored in cells of an SRAM. Cells in which the data is successfully overwritten are considered to be defective. (See *Weak Write Test mode: A SRAM Cell Stability Design for Test Technique*, IEEE Intentional Test Conference, July 1997, incorporated by reference).

As shown in FIG. 1, an SRAM column, for example, can be driven by an SRAM column write driver 10. Driver 10 uses conventional inverters 16, 18 (comprised of devices 20, 22, 26, 28) to invert, respectively, input signal din 24 to produce bit #12 and input signal din #30 to produce bit 14.

In normal operation, a weak write control signal weak #32 is held high (logic 1), keeping p-device 34 on and (through inverter 38) p-device 36 off. n-device 40 is also kept on.

Driver 10 is placed into WWTM mode by driving weak #32 low, which switches device 34 on and device 36 off. Device 40 also turns off. Diode-connected transistor 44 then supplies a weak write current onto either bit 12 or bit #14, depending on which of the inputs din or din # is on. By a "weak" current we mean a current in the range of tens of nano-amperes to a few micro amperes.

The diode-connected transistor 44 is carefully sized using SPICE simulations, but mismatches can occur between the simulation and the related physical device (e.g., a fabricated chip).

Multiple diodes can be stacked to obtain different current values.

DESCRIPTION (FIGS. 1 and 2 are circuit diagrams of write drivers.

Figure 1:
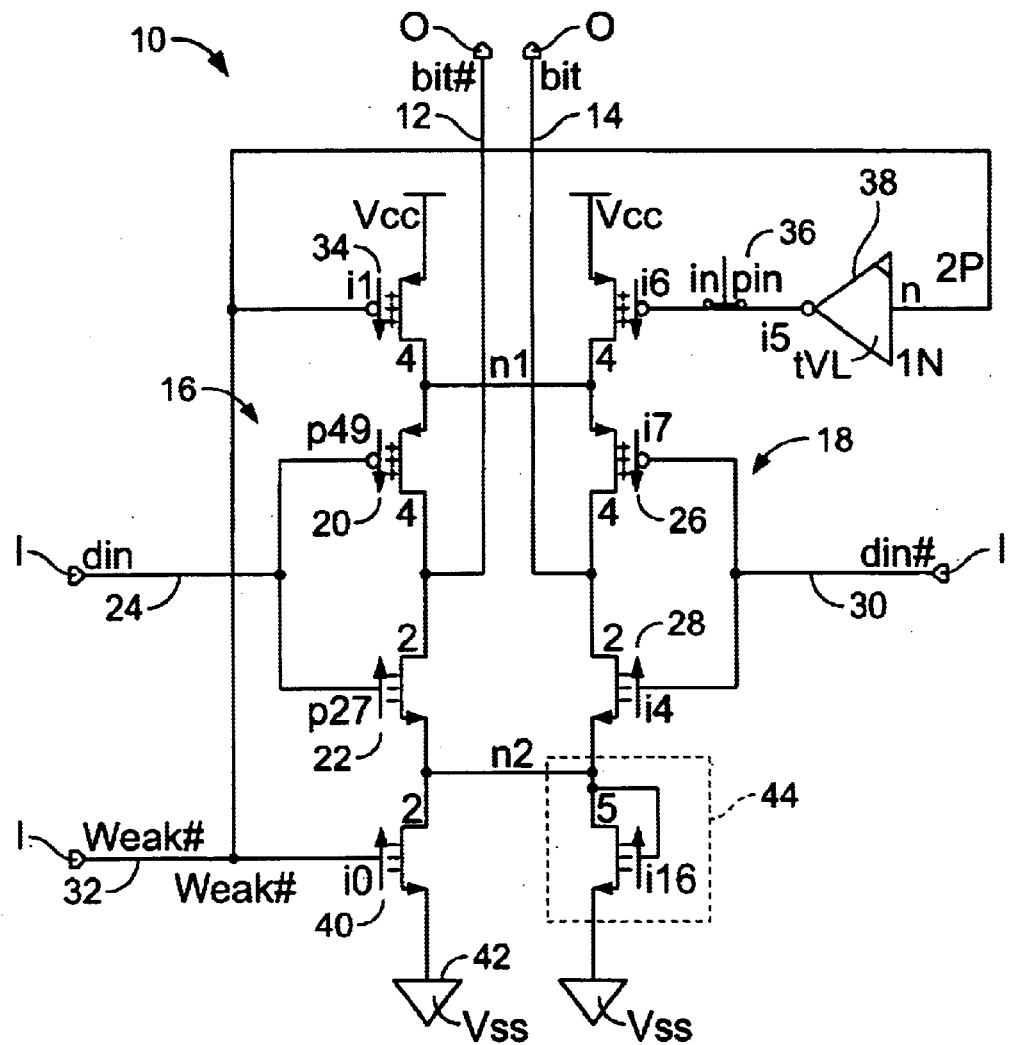
Figure 2:
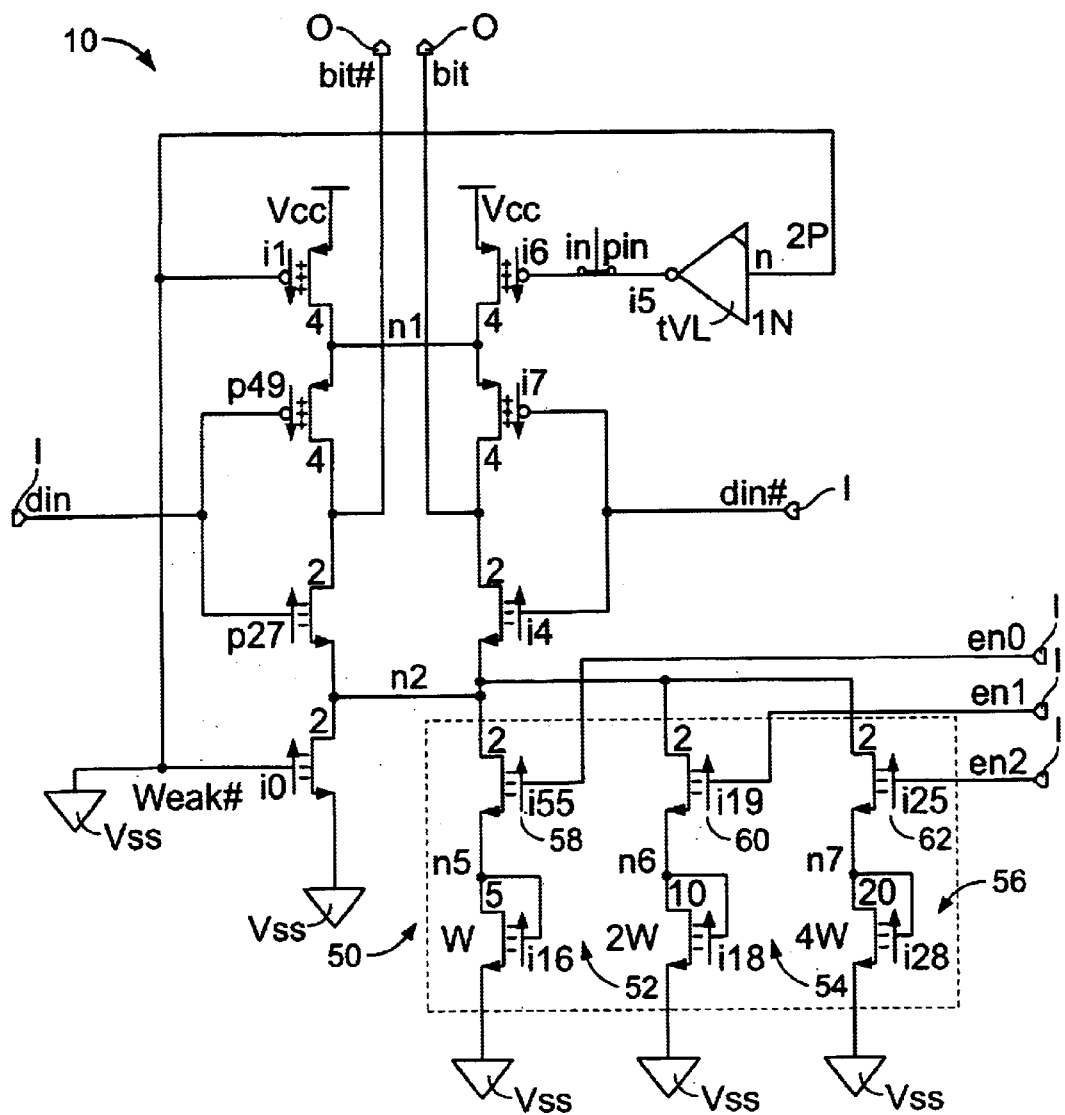

As shown in FIG. 2, by providing a programmable weak current circuit 50, which replaces device 44 in the write driver 10 of FIG. 1, it is possible to tune the magnitude of the weak current after fabrication on a chip in order to accommodate fabrication variations. This arrangement makes it unnecessary to rely on a weak current element that has a fixed (sometimes inappropriate) size determined in advance by a circuit simulation.

Circuit 50 includes multiple (three, in this example) parallel diode-connected transistor legs 52, 54, 56. Each of the legs has a corresponding enable signal en0, en1, en2 which controls one of three n-devices 58, 60, 62. By sizing (weighting) the three diode-connected transistors 52, 54, 56 in the ratio of 1:2:4 and by controlling the binary enable signals en0, en1, and en2 appropriately, seven different levels of weak current can be achieved (the levels then have relative values of 1, 2, 3, 4, 5, 6, 7).

Other weighting schemes can be used including a linear weighting, a logarithmic weighting, or an exponential weighting, or any combination of them.

Figure 3:
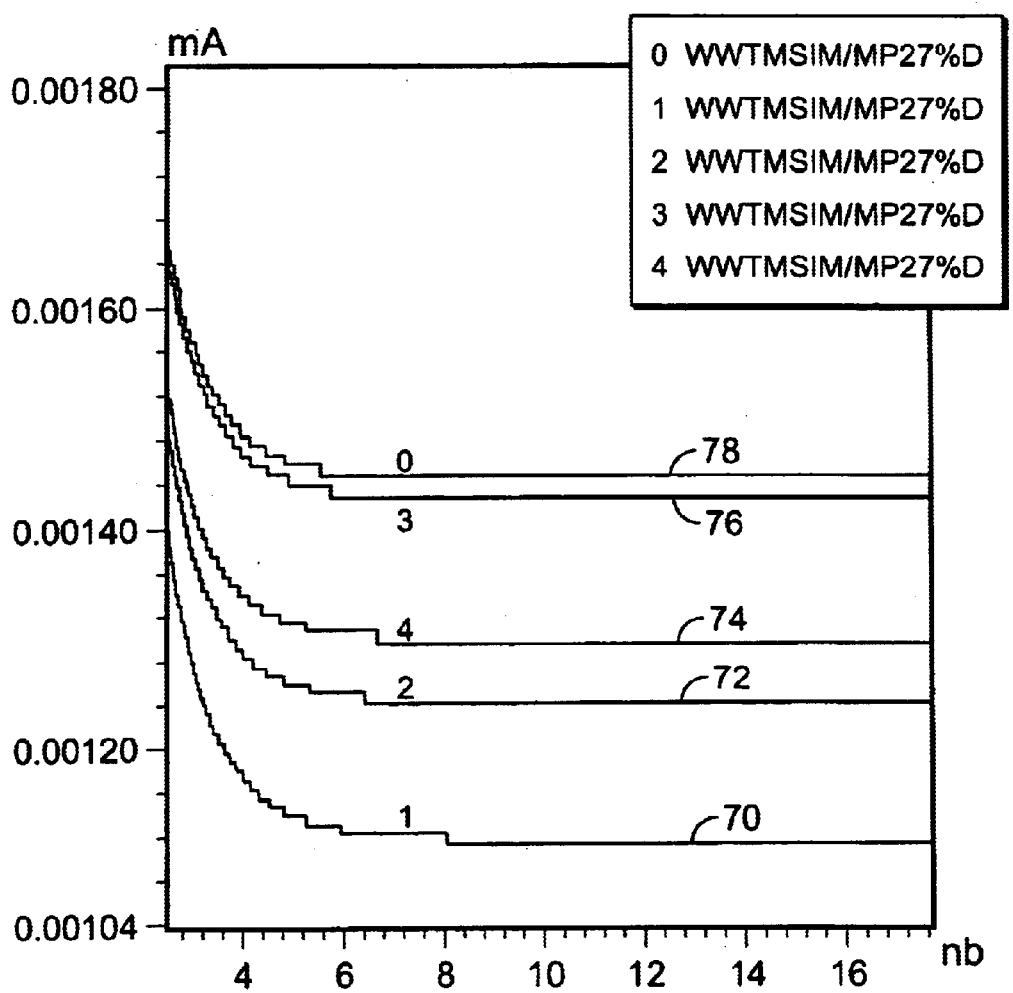
FIG. 3 shows current curves.

FIG. 3 shows five of the currents curves 70, 72, 74, 76, 78 that correspond to the following binary combinations of the enable signals, where en2 is in the least significant bit position: 100, 110, 001, 011, 111.

The additional elements represented by circuit 50 in FIG. 2 are unobtrusive and do not interfere with normal operation of the remainder of the circuit shown in the figure in any way. When the circuit 50 is OFF (i.e., the enables (en0–en2) are turned OFF (logic 0), all of the legs 52, 54, 56 are saving power. In addition, circuit 50 imposes minimal impact on the area of the chip being fabricated because it requires only two additional diodes and three enable transistors to provide seven different selectable currents.

Other embodiments are within the scope of the following claims.

For example, an algorithm can be used to do the sizing of the diode legs, and any number of legs can be used to increase the range or granularity of the available currents.

The invention is useful in and application to any environment in which variable or programmable weak current sources are useful, for example, device leakage modeling and analysis.

Figure 4:
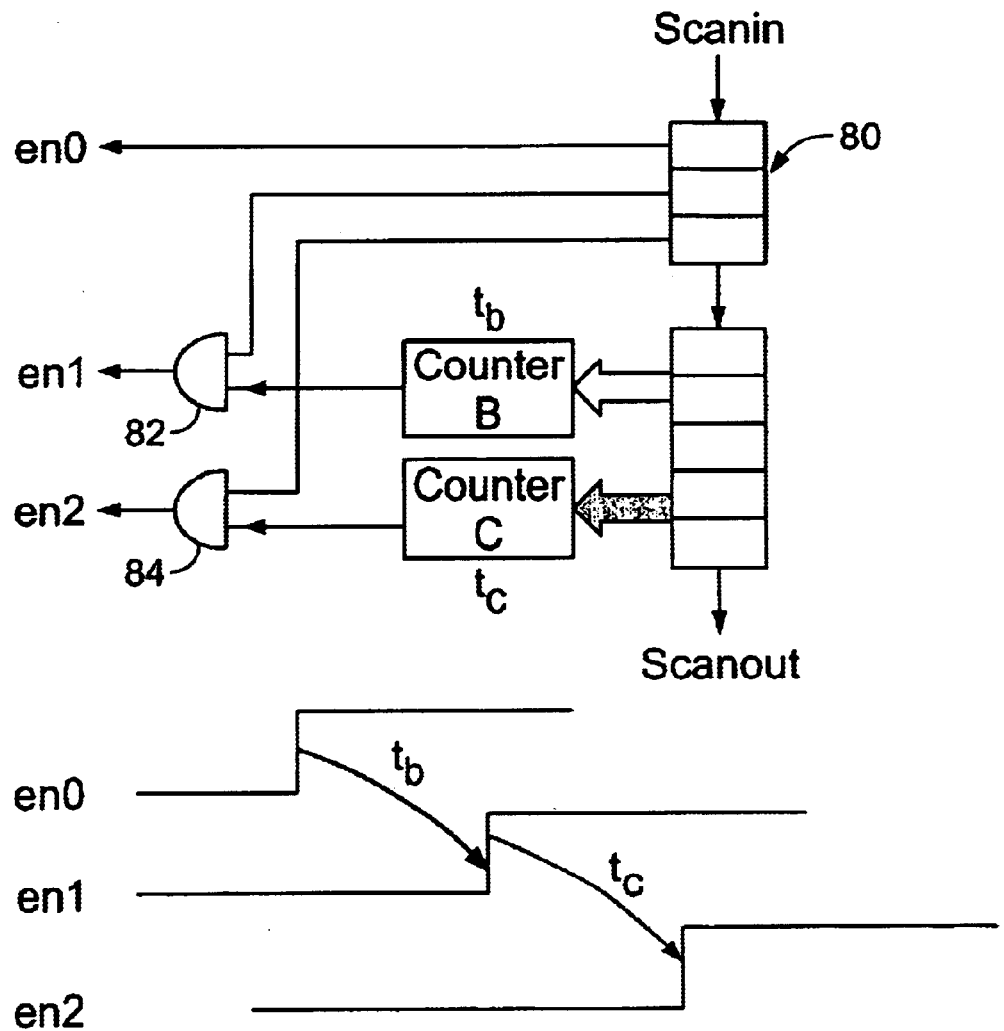
FIG. 4 is a circuit diagram that includes a scan register.)

As shown in FIG. 4, the timing of each weak write current enable signal can be controlled using a scan register 80 (also called a configuration register) to feed in weak current settings (the settings of the enable signals en0, en1, and en2) and timer settings for the timing of the application of the enable signals. The timer settings control counters B and C to delay the deliver of the en1 and en2 signals by delay periods tb and tc, by triggering the gates 82, 84. As shown in the lower part of the figure, the scanned-in en0 signal is delivered immediately, the scanned-in en1 signal is delivered after a delay of tb and the scanned-in en2 signal is delivered after an additional delay of tc seconds Scanning of signals in this way provides an inexpensive way of bringing the control data into the chip with only a fixed "pin" penalty and supports larger number of enables and timers.

What is claimed is:

1. Apparatus comprising
   electronic elements comprising a weak current source, the electronic elements configured to enable different selected levels of weak current to be delivered to a circuit, and
   a control input connected to the electronic elements to receive control signals that specify a selected one of the different selected levels of weak current.

2. The apparatus of claim 1 also including control devices connected to enable or disable respective ones of the electronic elements in response to the control signals.

3. The apparatus of claim 1 in which the electronic elements comprise diode-connected transistors.

4. The apparatus of claim 1 in which the electronic elements comprise elements whose relative effects on the weak current to be delivered represent a binary weighting.

5. The apparatus of claim 1 in which the electronic elements comprise elements whose relative effects on the weak current to be delivered represent at least one of: a linear weighting, a logarithmic weighting, or an exponential weighting.

6. The apparatus of claim 1 in which the different selected levels of weak current comprise discrete levels within a range of weak current between twenty nano-amperes and two micro-amperes.

7. The apparatus of claim 1 also including SRAM driver circuitry connected to the electronic elements and to an SRAM.

8. The apparatus of claim 1 in which the control input is connected to receive a combination of enabling signals.

9. The apparatus of claim 8 in which the enabling signals are provided by a scan register.

10. The apparatus of claim 9 in which the scan register receives weak current settings and timer settings for timing the application of the enable signals.

11. The apparatus of claim 9 in which the scan register is formed as part of an integrated circuit on which the weak current source is also formed.

12. Apparatus comprising a weak current source comprising a set of diode-connected transistor legs connected in parallel, the respective legs being sized to have different respective effects on a weak current output, each of the legs including a control element configured to disable or enable the weak current effect of the leg in response to a binary input appearing on a port.

13. The apparatus of claim 12 in which the control element comprises a switch.

14. A method comprising generating a weak current source on an integrated circuit, and controlling a level of the weak current source in response to a programmed control signal.

15. The method of claim 14 in which the level is controlled by enabling or disabling electronic elements in response to the programmed control signal.

16. The method of claim 15 in which the programmed control signal is delivered through a scan register.

17. The method of claim 14 in which the weak current is generated using a diode-connected transistor.

18. A write driver for an SRAM comprising inverters connected to receive input signals and to drive the SRAM in response to the input signals, electronic elements comprising a weak current source configured to drive the SRAM during testing, the electronic elements configured to enable different selected levels of weak current to be delivered to a circuit, and a control input connected to the electronic elements to receive control signals that specify a selected one of the different selected levels of weak current.

19. The apparatus of claim 18 in which the electronic elements comprise diode-connected transistors.

20. The apparatus of claim 18 in which the electronic elements comprise elements whose relative effects on the weak current to be delivered represent a binary weighting.

21. The apparatus of claim 18 in which the different selected levels of weak current comprise discrete levels within a range.

22. The apparatus of claim 18 also including SRAM driver circuitry connected to the electronic elements and to an SRAM.

* * * * *